United States Patent
Hattori et al.

(10) Patent No.: US 10,141,861 B2
(45) Date of Patent: Nov. 27, 2018

(54) POWER CONVERSION UNIT, POWER CONVERTER AND METHOD OF MANUFACTURING POWER CONVERTER

(71) Applicant: Hitachi, Ltd., Chiyoda-ku, Tokyo (JP)

(72) Inventors: Yukio Hattori, Tokyo (JP); Hiroshi Kamizuma, Tokyo (JP); Daisuke Matsumoto, Tokyo (JP); Akira Mima, Tokyo (JP); Tetsuya Kawashima, Tokyo (JP); Yuuichi Mabuchi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/880,698

(22) Filed: Jan. 26, 2018

(65) Prior Publication Data

US 2018/0152117 A1 May 31, 2018

Related U.S. Application Data

(63) Continuation of application No. 15/022,695, filed as application No. PCT/JP2014/058925 on Mar. 27, 2014, now Pat. No. 9,917,529.

(51) Int. Cl.
*H02M 7/00* (2006.01)
*H05K 7/14* (2006.01)
(Continued)

(52) U.S. Cl.
CPC .......... *H02M 7/003* (2013.01); *H02M 7/219* (2013.01); *H02M 7/53871* (2013.01); *H05K 7/1432* (2013.01)

(58) Field of Classification Search
CPC .. H02M 7/219; H02M 7/53871; H02M 7/003; H05K 7/1432
See application file for complete search history.

(56) References Cited

U.S. PATENT DOCUMENTS 7,881,086 B2 2/2011 Nakayama et al.
9,906,154 B2 * 2/2018 Hattori et al. .......... H02M 7/48
(Continued)

FOREIGN PATENT DOCUMENTS

CA 2 751 034 9/2010
JP 1-186176 A 7/1989
(Continued)

OTHER PUBLICATIONS

International Search Report (PCT/ISA/210) issued in PCT Application No. PCT/JP2014/058925 dated Jun. 3, 2014 with English translation (Four (4) pages).
(Continued)

*Primary Examiner* — Kyle J Moody
(74) *Attorney, Agent, or Firm* — Crowell & Moring LLP

(57) ABSTRACT

To improve accessibility with respect to a power conversion unit in a power converter. The power converter includes a circuit connection part including a positive electrode conductor, a negative electrode conductor and an AC conductor, a power semiconductor module positioned in a particular direction with respect to the circuit connection part and connected to the positive electrode conductor, the negative electrode conductor and the AC conductor and a capacitor positioned in the particular direction with respect to the circuit connection part and connected to the positive electrode conductor and the negative electrode conductor. The positive electrode conductor is connected to a positive electrode conductor of another power conversion unit through a unit connection part positioned in an opposite direction of the particular direction with respect to the circuit connection part. The negative electrode conductor is connected to a negative electrode conductor of another power conversion unit through the unit connection part.

6 Claims, 20 Drawing Sheets

(51) Int. Cl.
*H02M 7/219* (2006.01)
*H02M 7/5387* (2007.01)

(56) References Cited

U.S. PATENT DOCUMENTS

| 10,008,953 B2* | 6/2018 | Kamizuma | H02M 7/217 |
|---|---|---|---|
| 2005/0152100 A1 | 7/2005 | Rodriguez et al. | |
| 2009/0219696 A1 | 9/2009 | Nakayama et al. | |
| 2014/0126087 A1 | 5/2014 | Hirose et al. | |
| 2016/0211741 A1 | 7/2016 | Ishino et al. | |
| 2016/0373017 A1 | 12/2016 | Mima et al. | |
| 2017/0033593 A1 | 2/2017 | Kamizuma et al. | |
| 2017/0040906 A1 | 2/2017 | Hattori et al. | |

FOREIGN PATENT DOCUMENTS

| JP | 2-174564 A | 7/1990 |
|---|---|---|
| JP | 8-294266 A | 11/1996 |
| JP | 9-47036 A | 2/1997 |
| JP | 11-8982 A | 1/1999 |
| JP | 2002-300787 A | 10/2002 |
| JP | 2012-95472 A | 5/2012 |
| JP | 2012-105382 A | 5/2012 |
| JP | 2014-171342 A | 9/2014 |
| WO | WO 2007/113979 A1 | 10/2007 |
| WO | WO 2010/097830 A1 | 9/2010 |
| WO | WO 2012/098780 A1 | 7/2012 |

OTHER PUBLICATIONS

Japanese Office Action issued in counterpart Japanese Application No. 2016-509764 dated Feb. 28, 2017 with partial English-language translation (eight (8) pages).
Unverified English-language translation of document 82 (JP 2012-105382 A) previously submitted on Mar. 17, 2016 (fifteen (15) pages).
Unverified English-language translation of document 85 (JP 2002-300787 A) previously submitted on Mar. 17, 2016 (eleven (11) pages).
Japanese-language Office Action issued in counterpart Japanese Application No. 2016-509764 dated Aug. 29, 2017 with English translation (Thirteen (13) pages).
Extended European Search Report issued in counterpart European Application No. 14886893.8 dated Oct. 20, 2017 (9 pages).

* cited by examiner

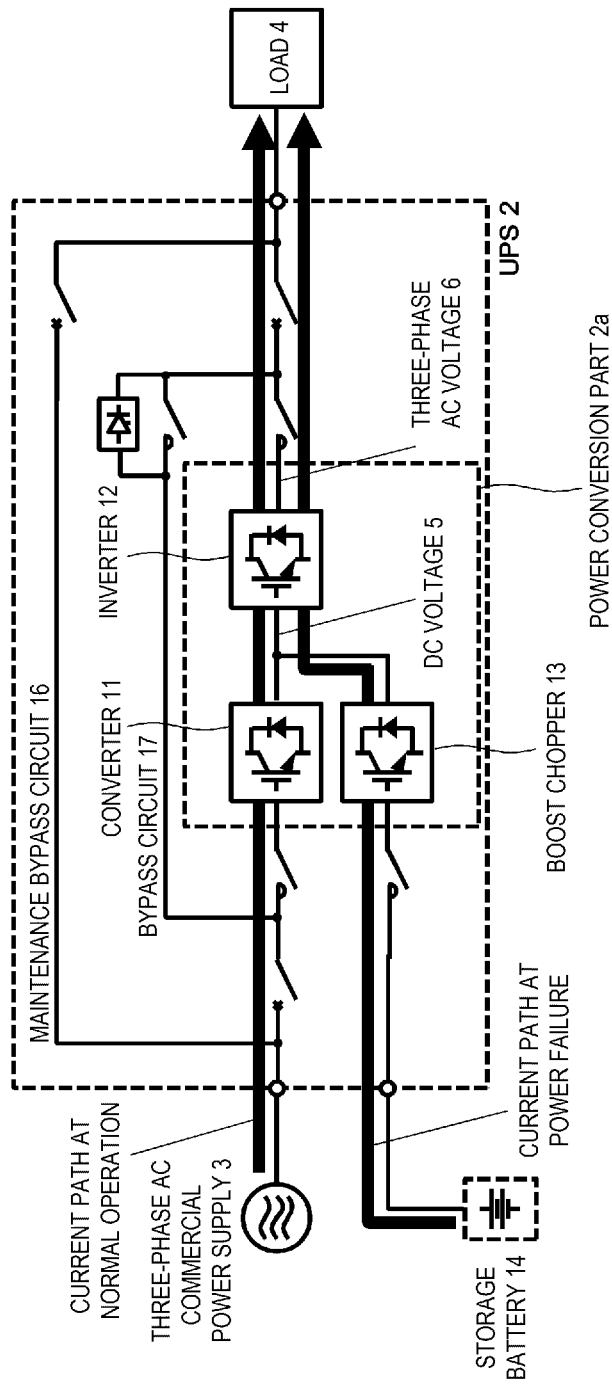
[FIG. 1]

[FIG. 2]
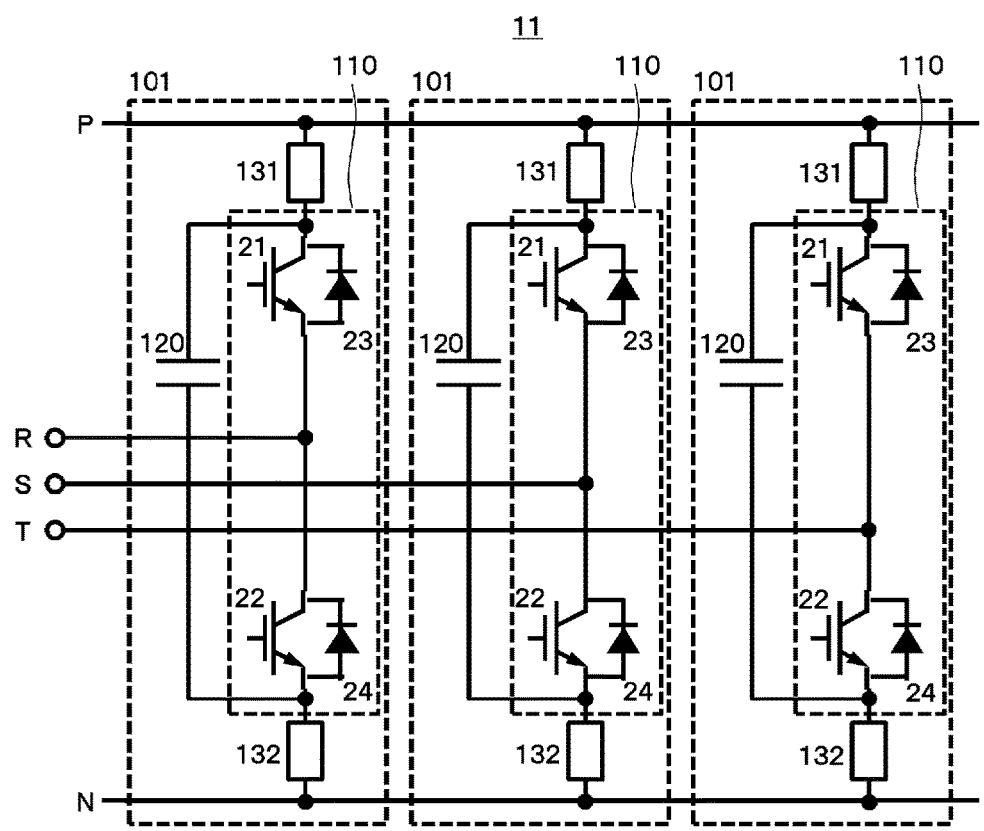

[FIG. 3]
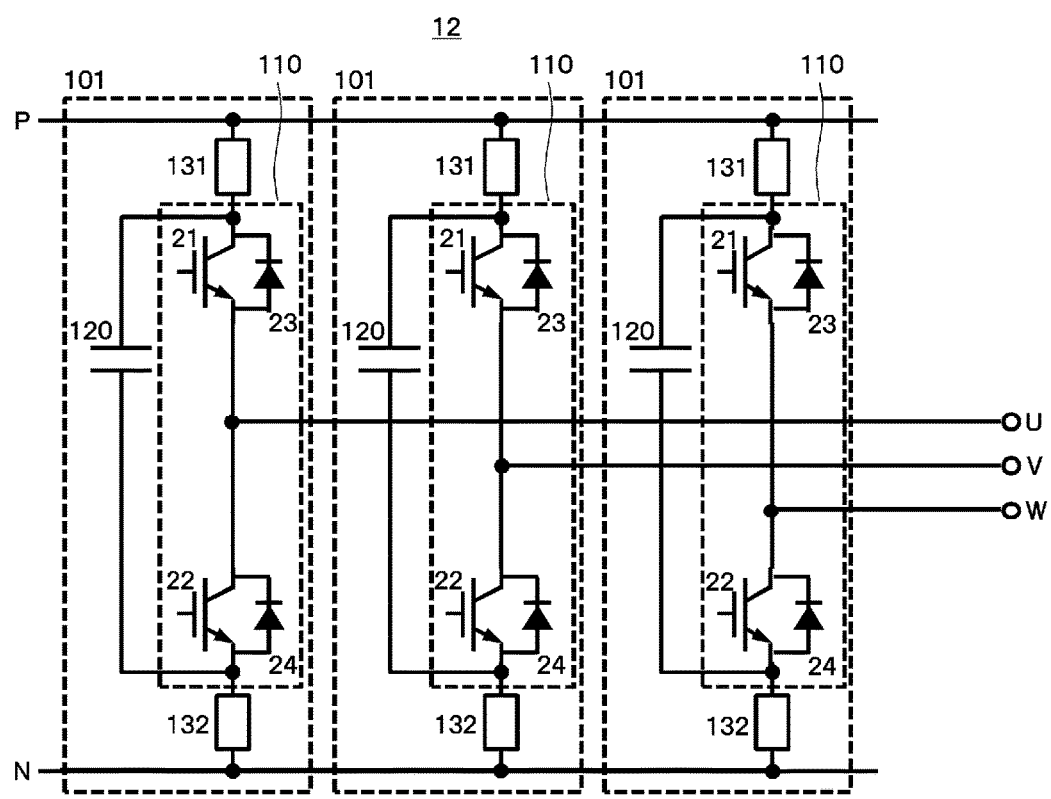

[FIG. 4]
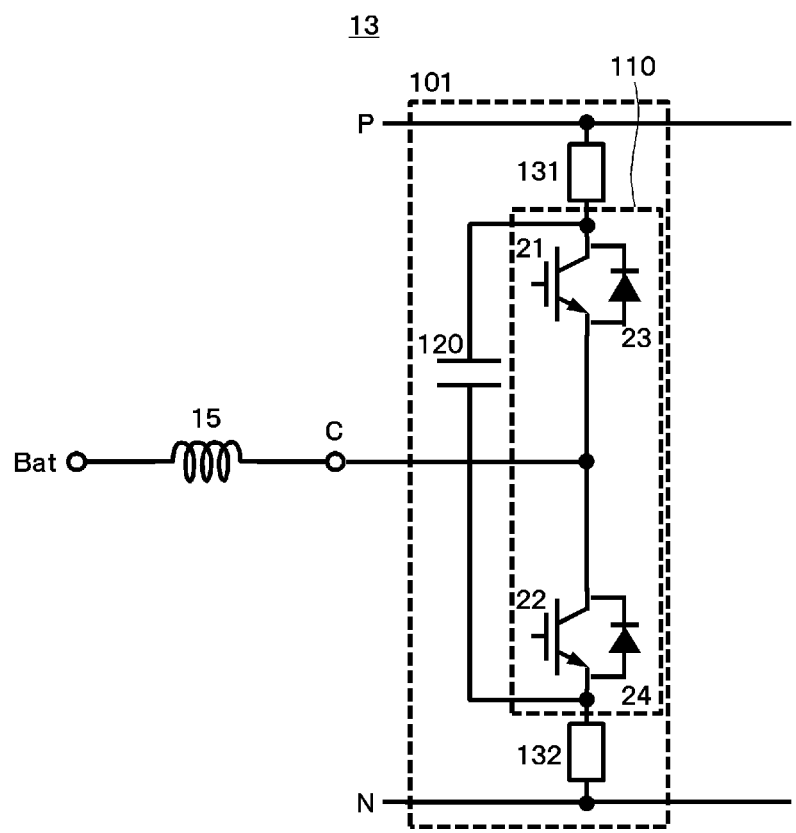

[FIG. 5]
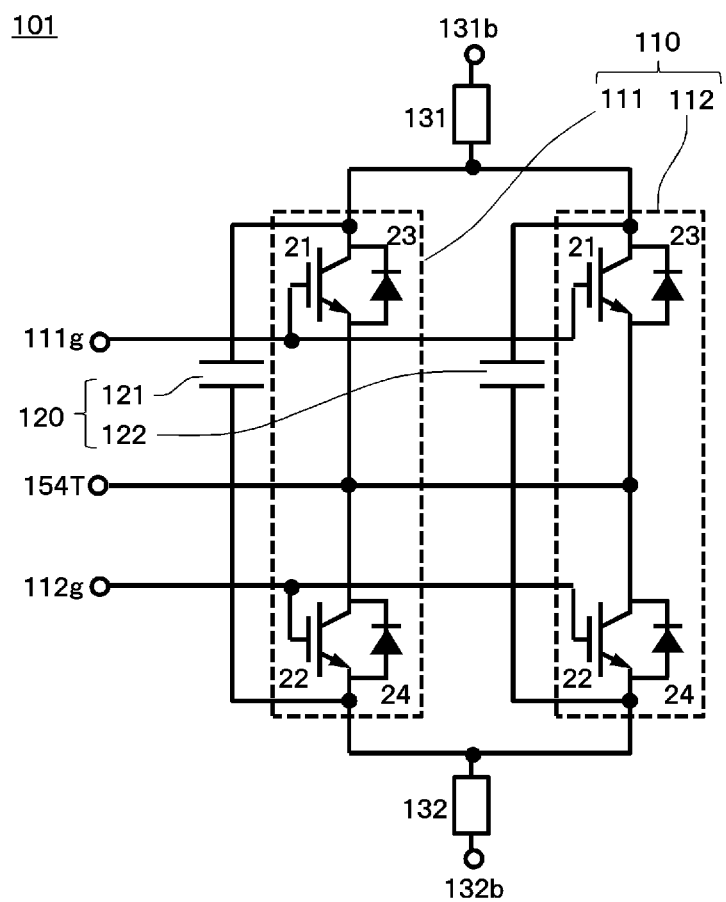

[FIG. 6]
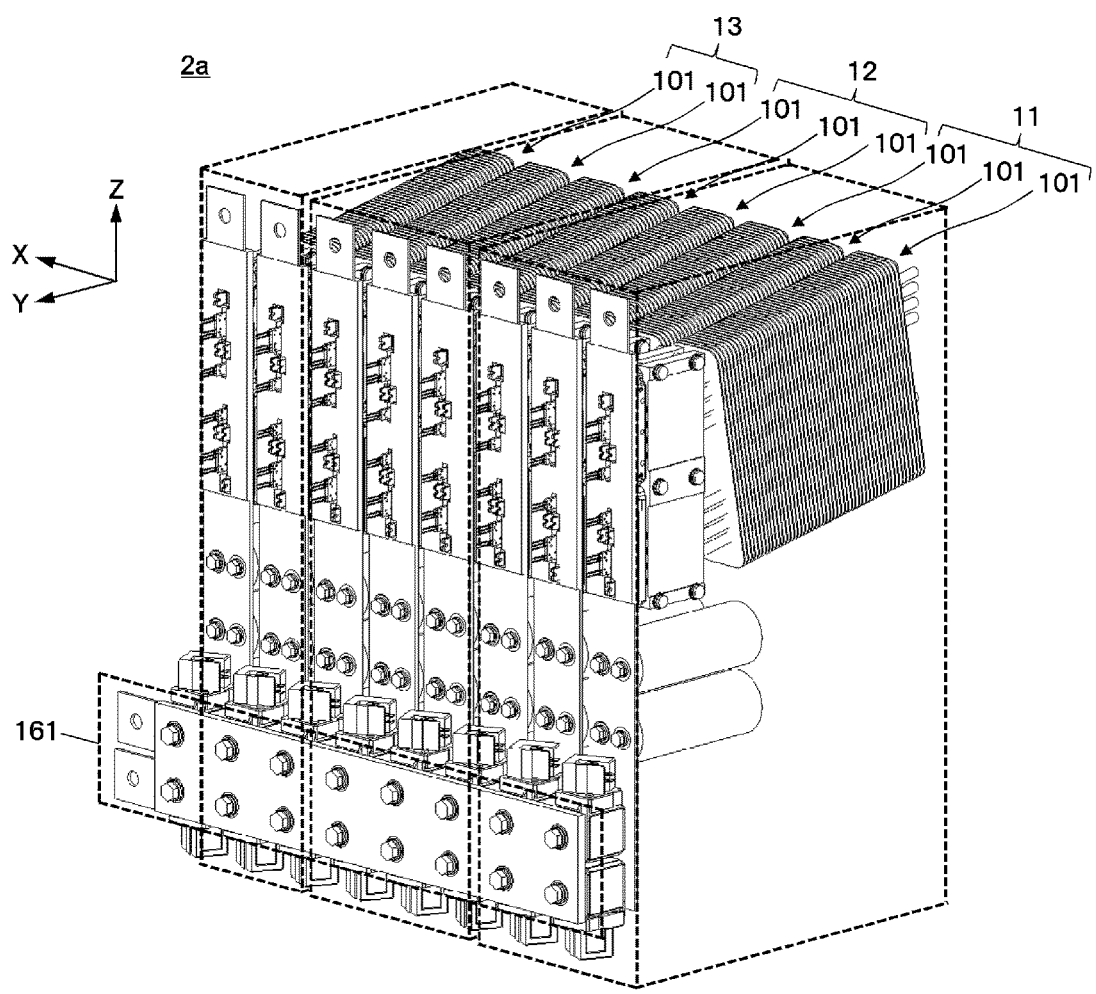

[FIG. 7]
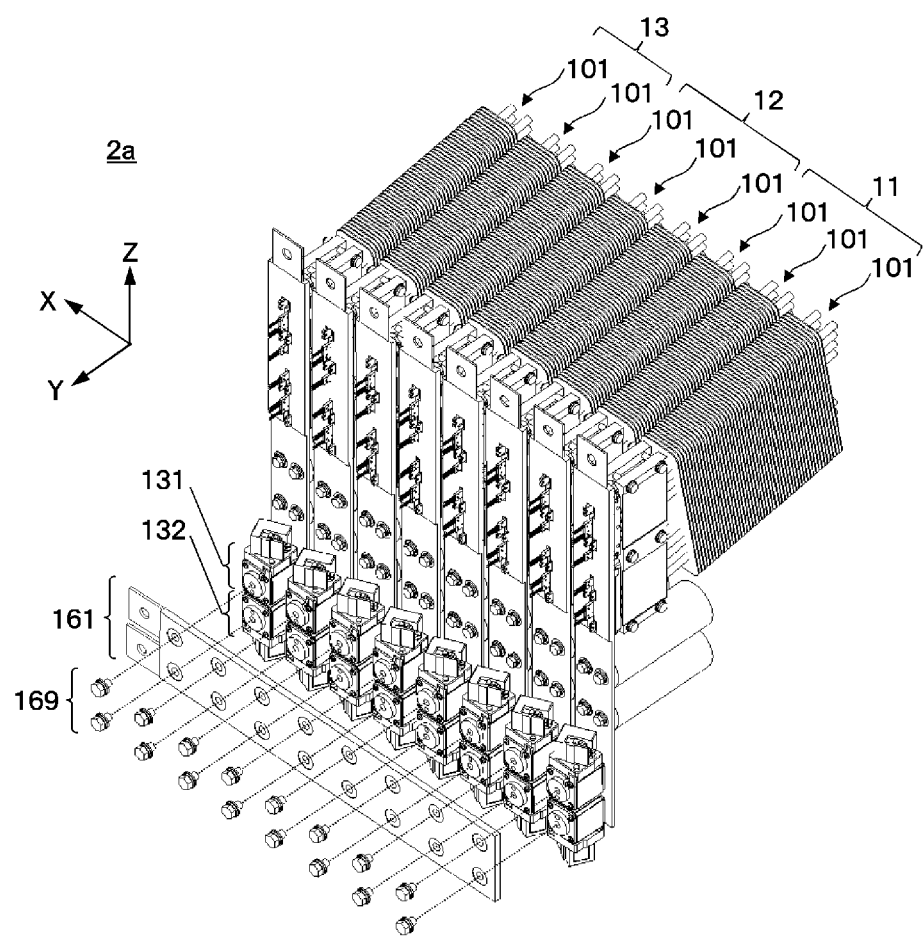

[FIG. 8]
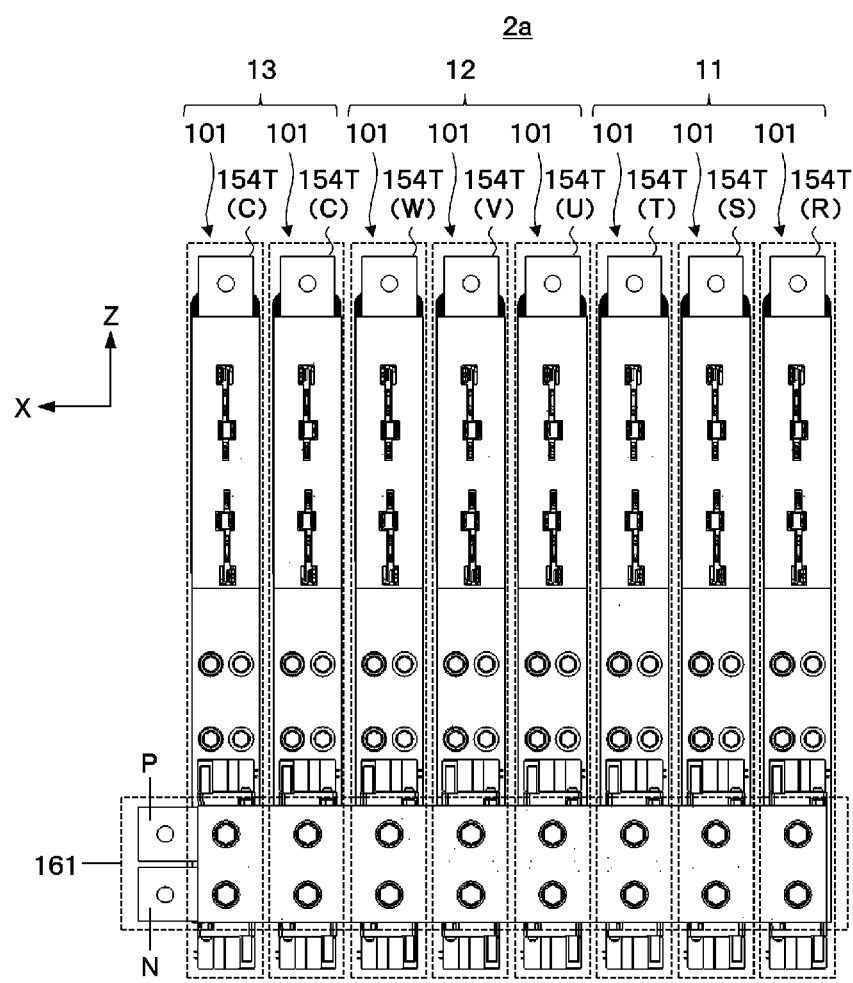

[FIG. 9]
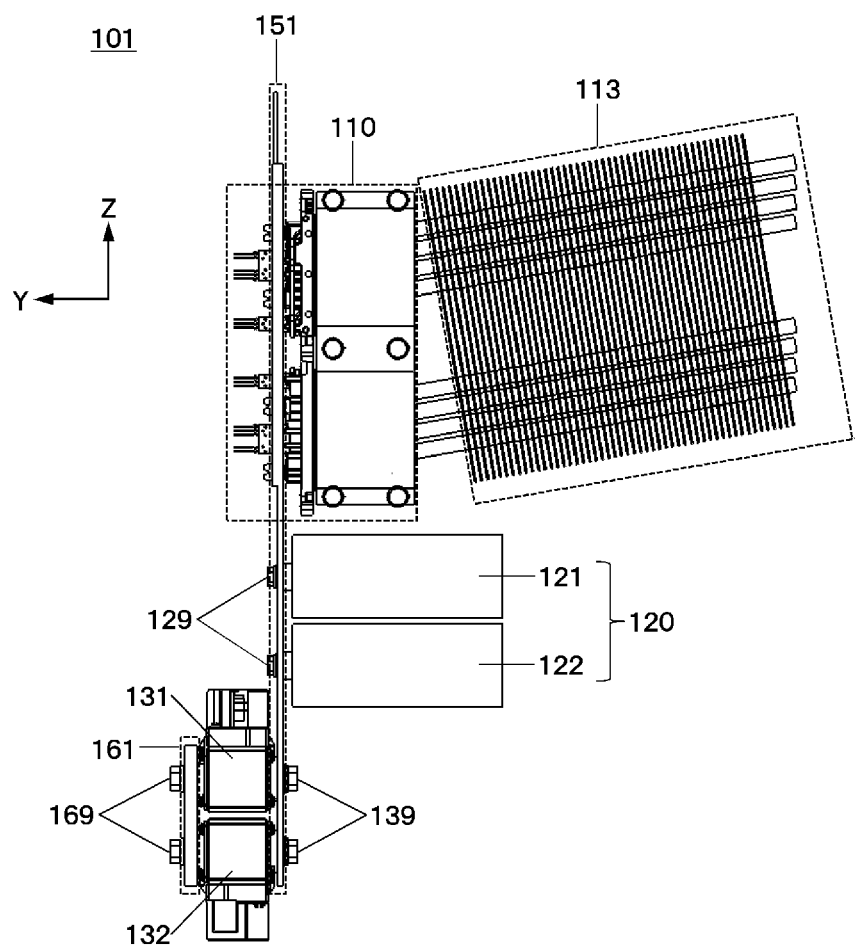

[FIG. 10]
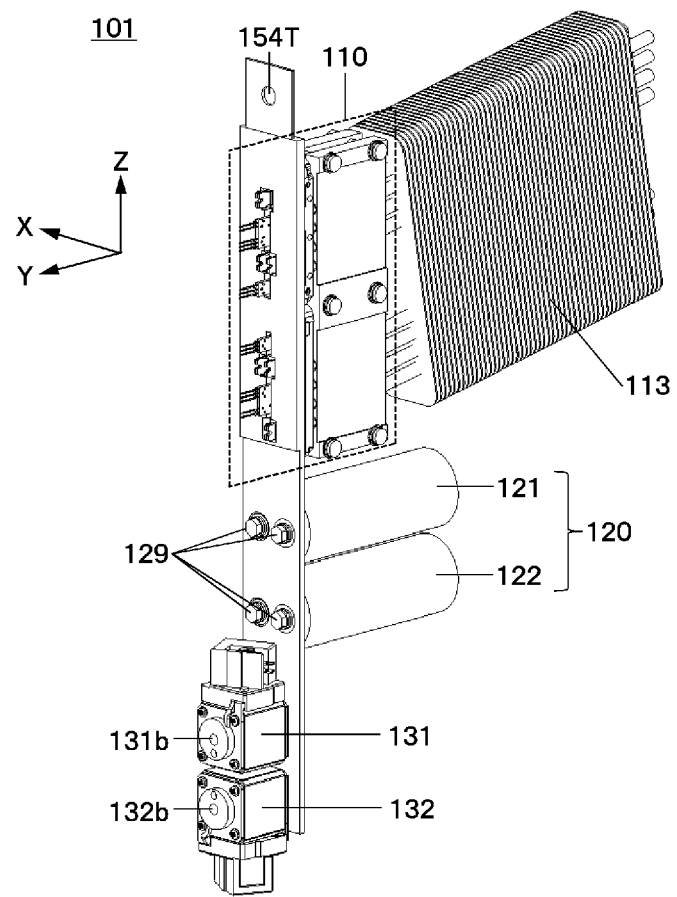

[FIG. 11]
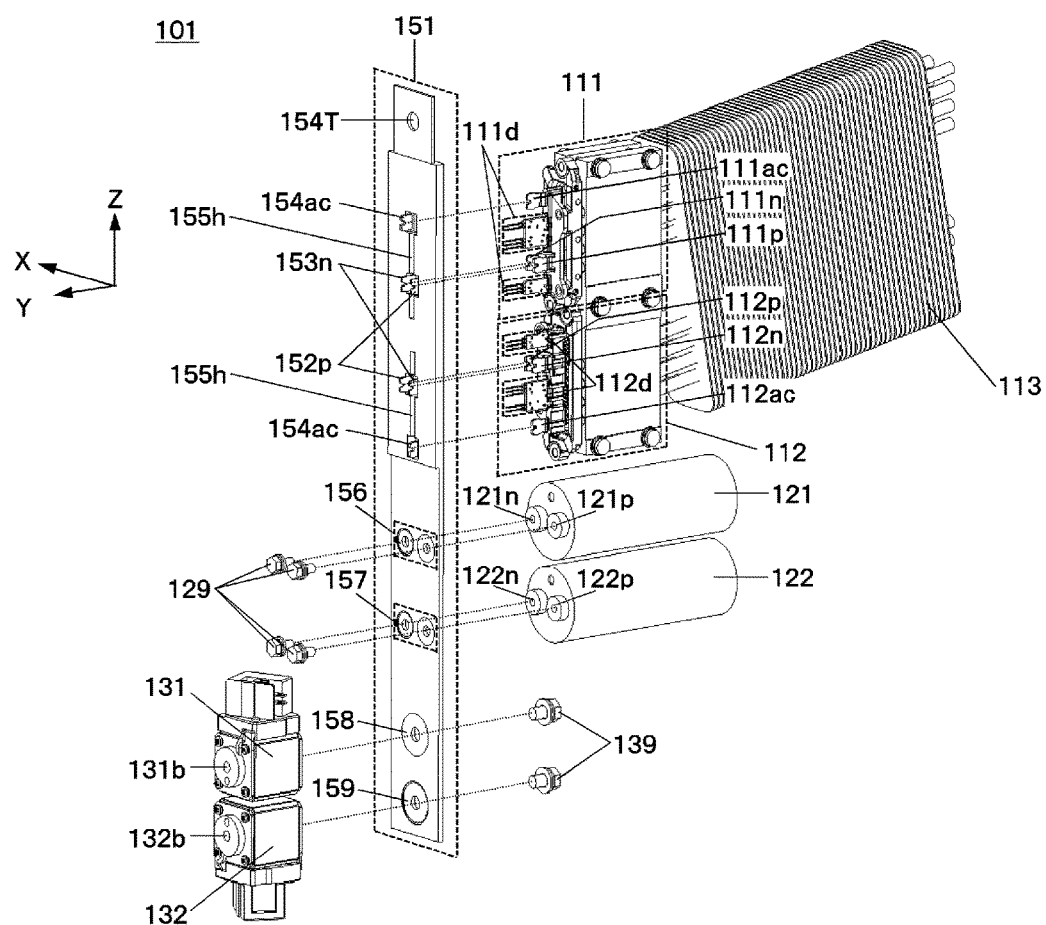

[FIG. 12]
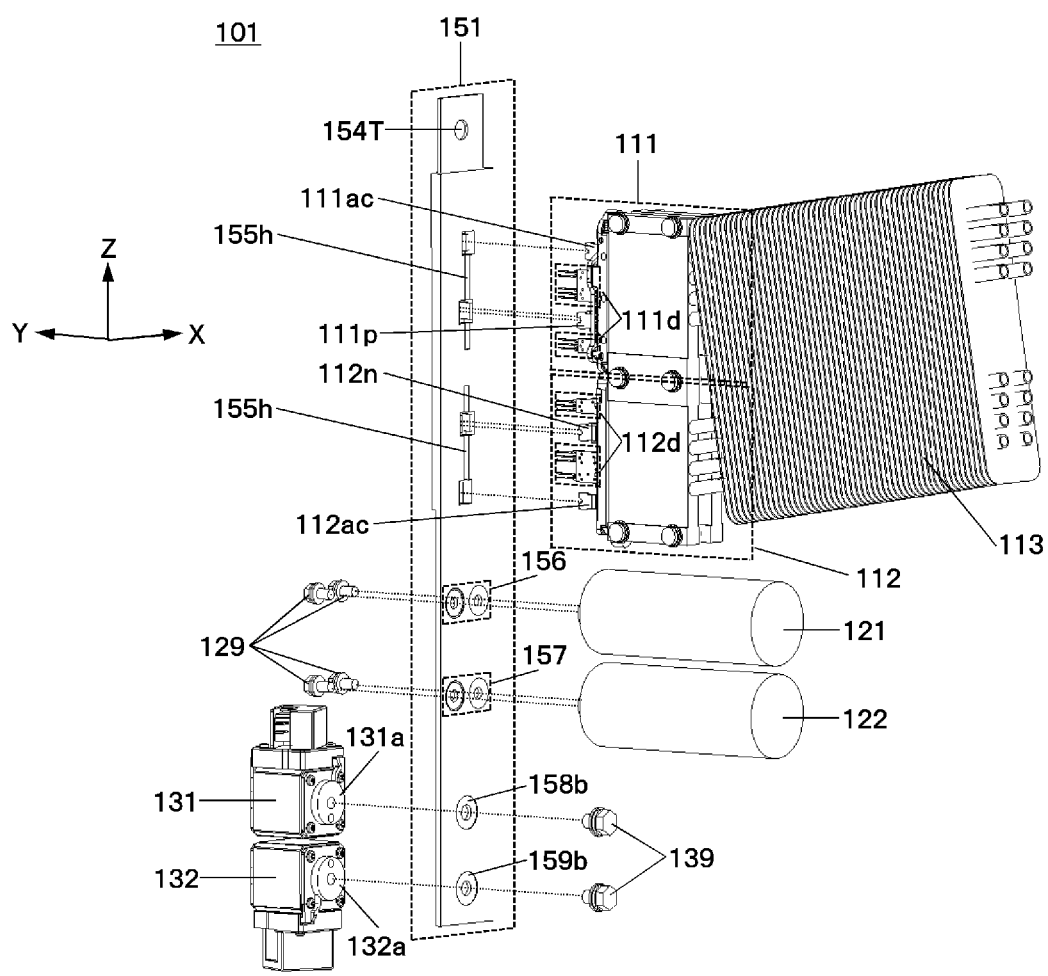

[FIG. 13]
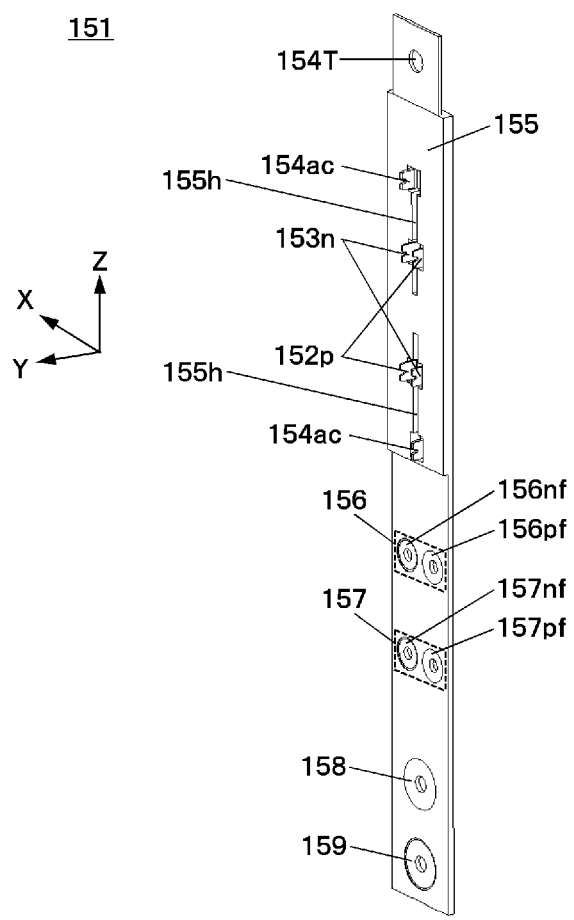

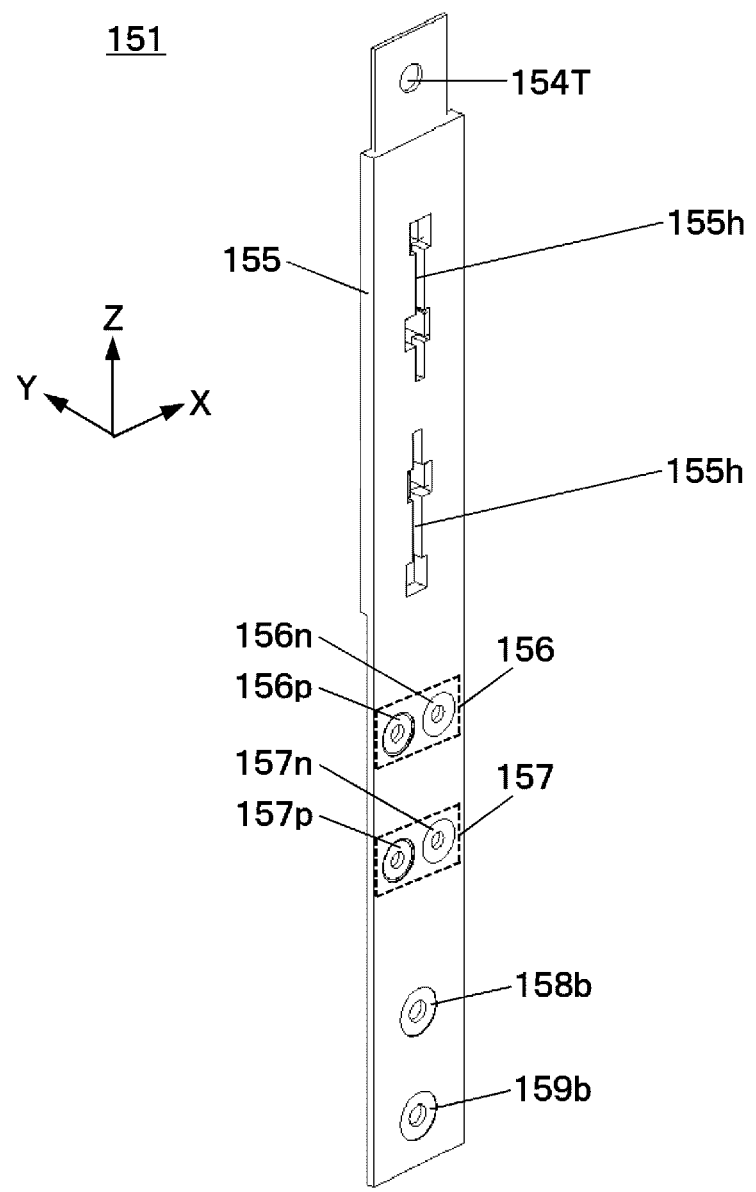
[FIG. 14]

[FIG. 15]
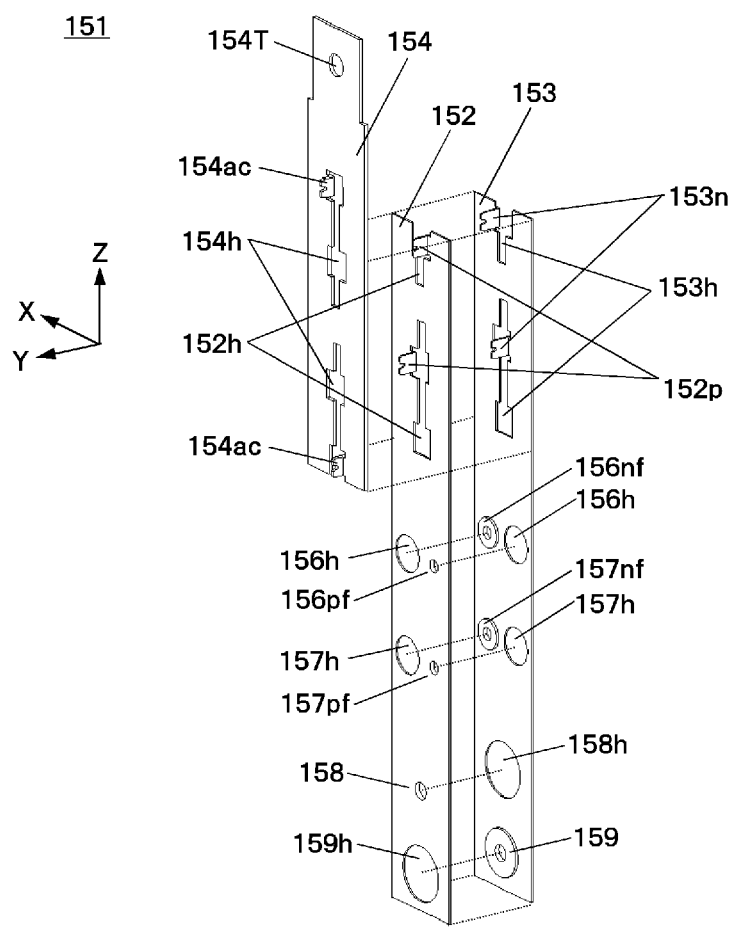

[FIG. 16]
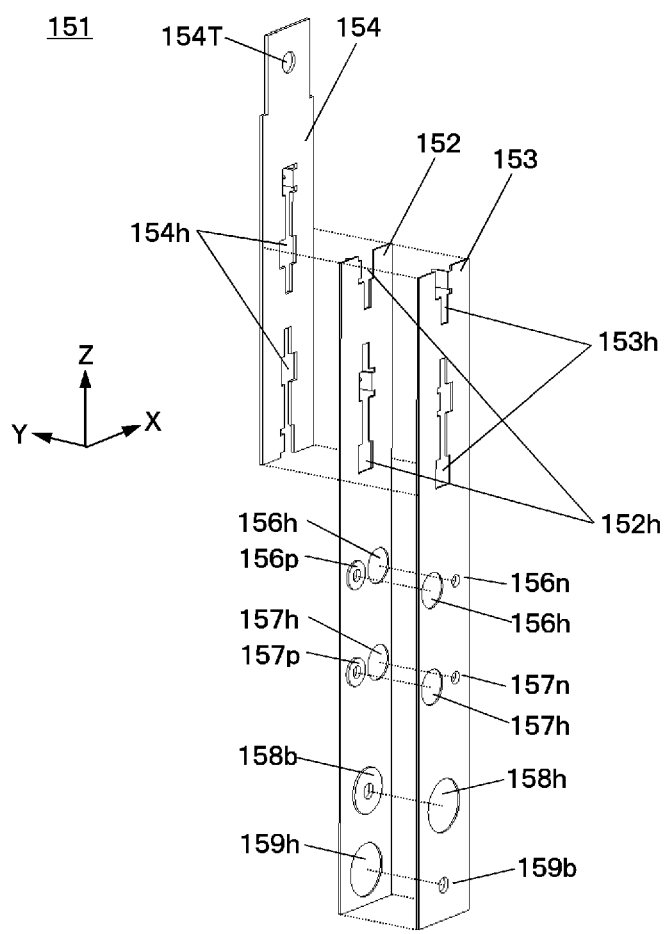

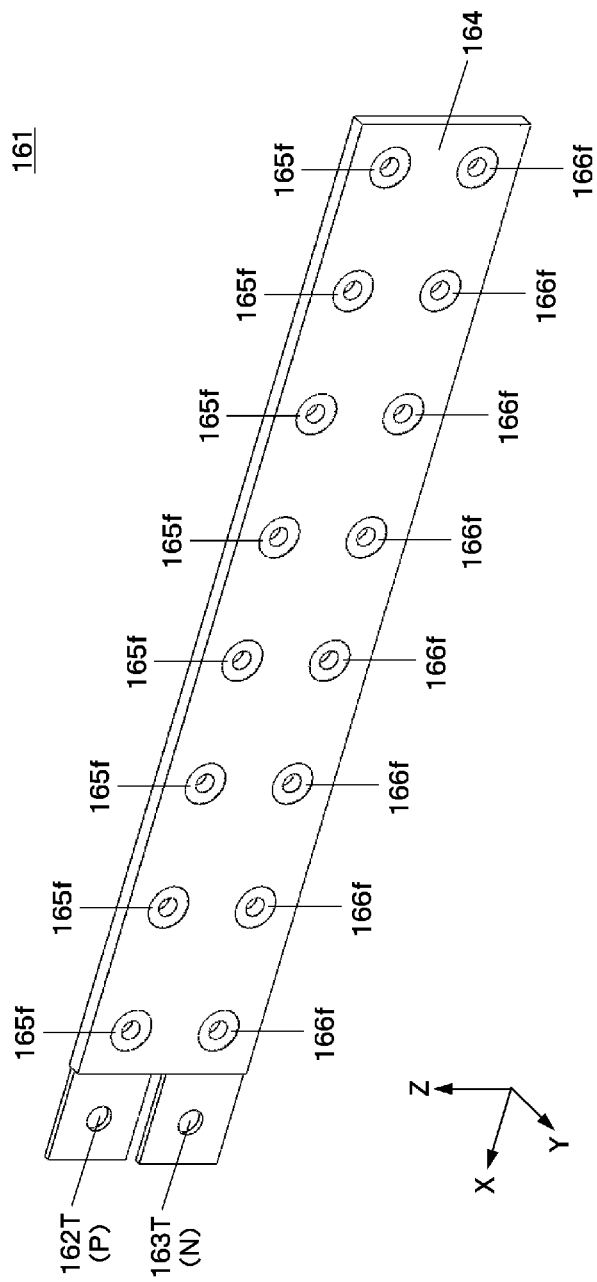
[FIG. 17]

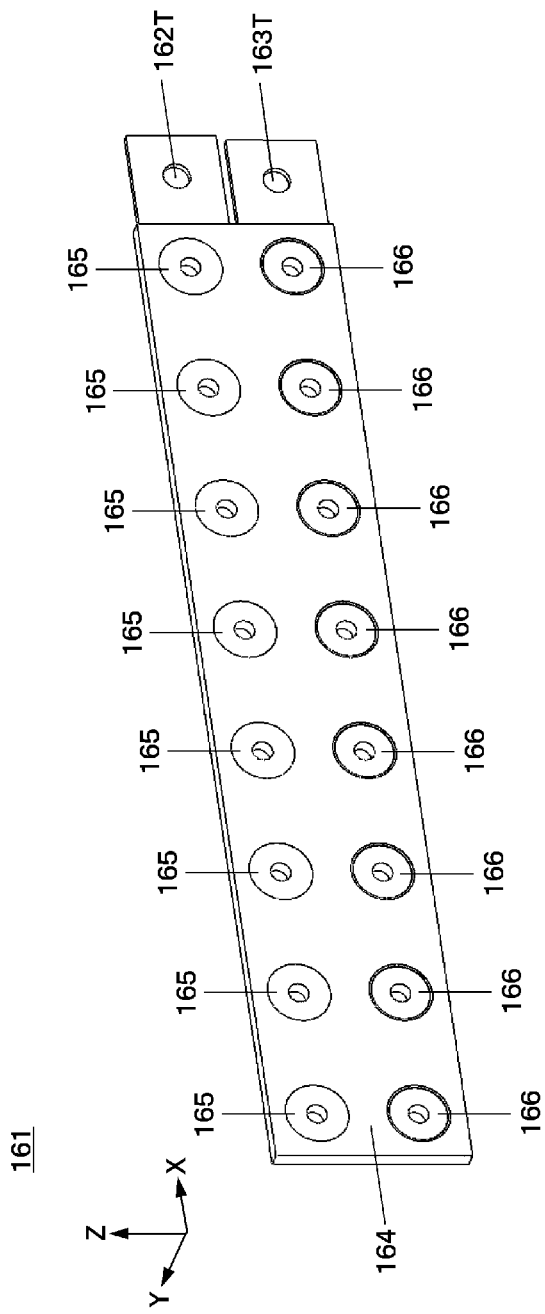
[FIG. 18]

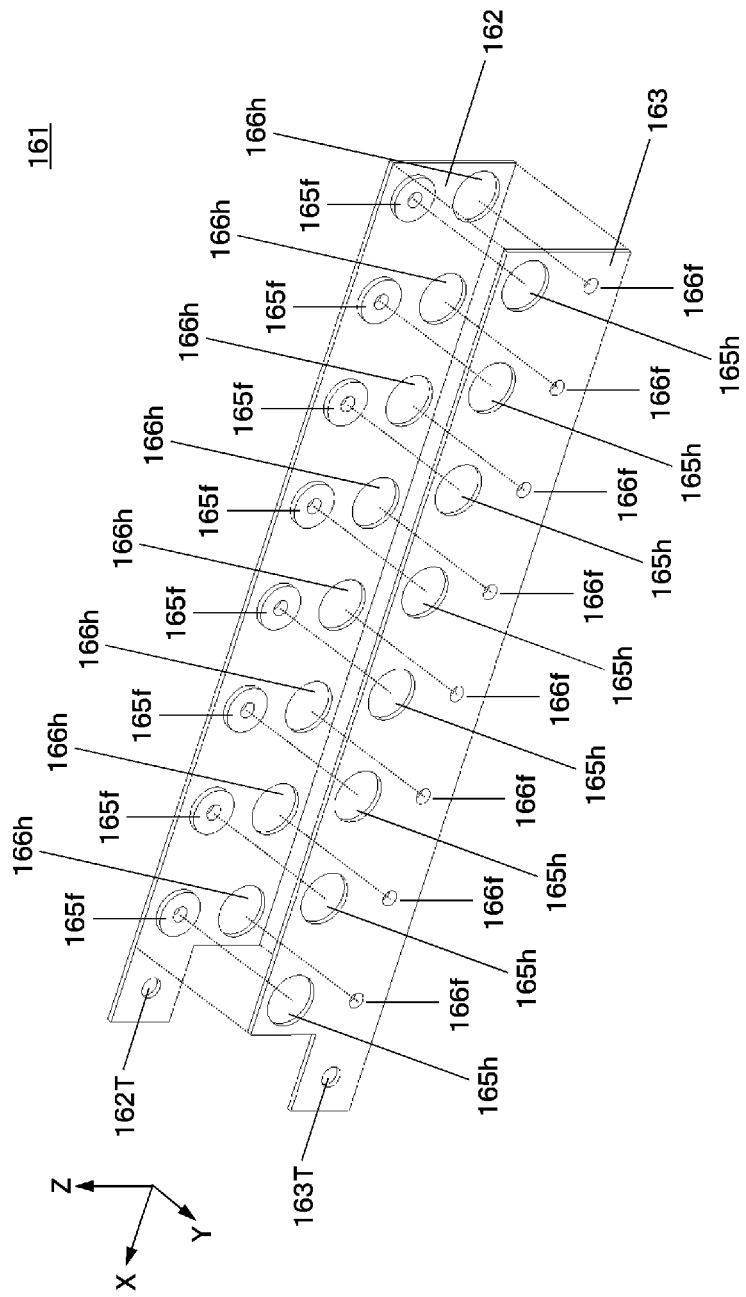
[FIG. 19]

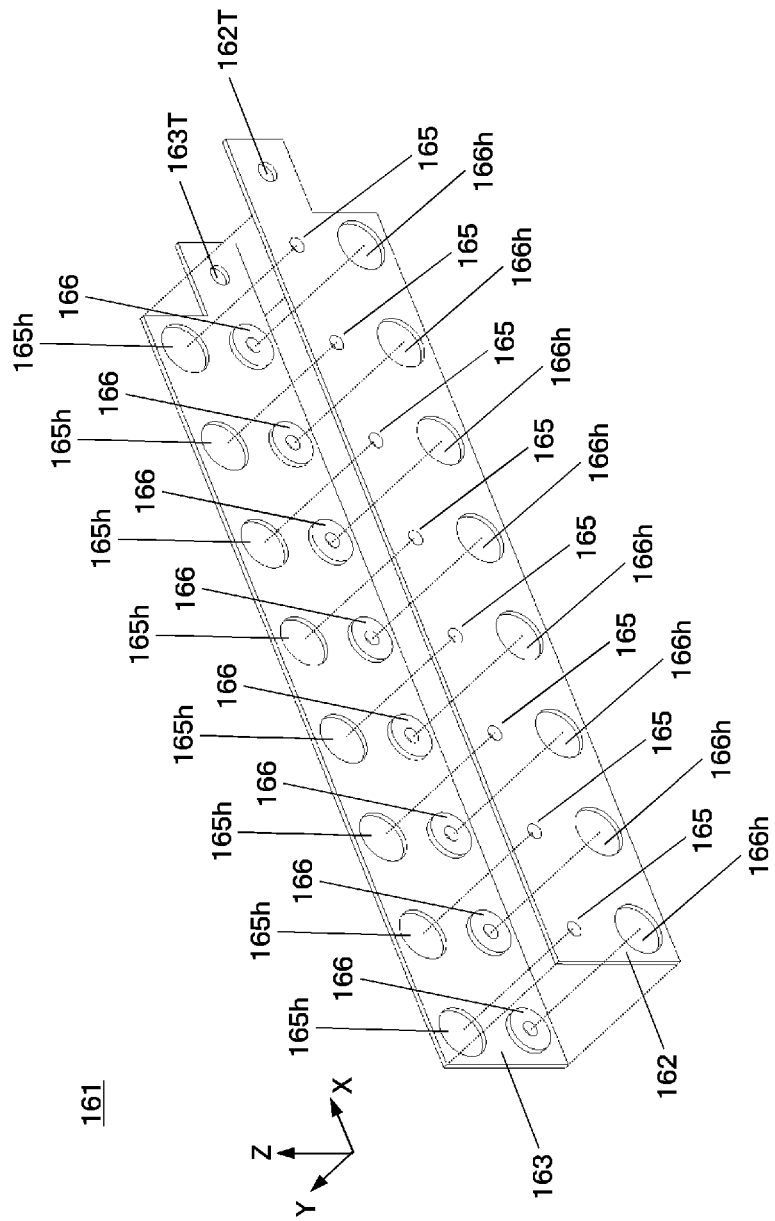
[FIG. 20]

POWER CONVERSION UNIT, POWER CONVERTER AND METHOD OF MANUFACTURING POWER CONVERTER

CROSS REFERENCE TO RELATED APPLICATIONS

This application claims priority to and the benefit of U.S. application Ser. No. 15/022,695, filed Mar. 17, 2016, the content of which is incorporated herein by reference in its entirety.

TECHNICAL FIELD

The present invention relates to a circuit for power conversion.

BACKGROUND ART

In a power converter, a switching operation is speeded up due to technical innovation of power semiconductors used for a power semiconductor module as a primary component of the power converter, and the loss in the power semiconductors is reduced. Accordingly, a cooler for cooling the power semiconductor module can be reduced in size, and resultantly the size reduction of the power converter is realized. Particularly, a UPS (Uninterruptible Power Supply) having the power converters is installed for data centers in suburbs of cities where land prices are high, therefore, it is required that the installation area is small. In order to effectively use the area of installation, respective power converters in the UPS are installed in a state where side surfaces closely contact one another and rear surfaces closely contact a wall. Accordingly, it is desirable that instruments and parts mounted in the apparatus are accessible from the front of the apparatus in consideration of workability at the time of maintenance.

A power converter for improving workability is known. In Patent Literature 1, a power module unit in which plural semiconductor devices are mounted in a cooling block provided with a cooler such as a cooling fin and a capacitor unit are respectively housed in two sections provided in a casing of the power converter. Accordingly, workability is improved.

CITATION LIST

Patent Literature

Patent Literature 1: JP-A-8-294266

SUMMARY OF INVENTION

Technical Problem

However, as the power module unit and the capacitor unit are housed in sections different from each other in the power converter described in Patent Literature 1, an inductance of a bus bar connecting these units is increased. As a ripple current with resonance is increased accordingly, a capacitor with a large capacity is required for allowing the ripple current, which leads to size increase of the power converter. Though workability of connecting the units with each other is improved, accessibility with respect to power modules and capacitors in the unit is not considered.

Solution to Problem

In order to solve the above problems, the power converter according to an embodiment of the present invention includes a circuit connection part including a positive electrode conductor, a negative electrode conductor and an AC conductor, a power semiconductor module positioned in a particular direction with respect to the circuit connection part and connected to the positive electrode conductor, the negative electrode conductor and the AC conductor, and a capacitor positioned in the particular direction with respect to the circuit connection part and connected to the positive electrode conductor and the negative electrode conductor. The positive electrode conductor is connected to a positive electrode conductor of another power conversion unit through a unit connection part positioned in an opposite direction of the particular direction with respect to the circuit connection part. The negative electrode conductor is connected to a negative electrode conductor of another power conversion unit through the unit connection part.

Advantageous Effects of Invention

According to an embodiment of the present invention, it is possible to improve accessibility with respect to a power conversion unit in a power converter.

BRIEF DESCRIPTION OF DRAWINGS

FIG. 1 shows a configuration of a UPS according to an embodiment.

FIG. 2 shows a circuit configuration of a converter 11.

FIG. 3 shows a circuit configuration of an inverter 12.

FIG. 4 shows a circuit configuration of a boost chopper 13.

FIG. 5 shows a configuration of a power conversion unit 101.

FIG. 6 is a perspective view showing a structure of a power conversion part 2a.

FIG. 7 is an exploded perspective view showing a structure of the power conversion part 2a.

FIG. 8 is a front view showing a structure of the power conversion part 2a.

FIG. 9 is a right side view showing a structure of the power conversion unit 101.

FIG. 10 is a perspective view showing a structure of the power conversion unit 101.

FIG. 11 is an exploded perspective view showing a structure of a front surface of the power conversion unit 101.

FIG. 12 is an exploded perspective view showing a structure of a back surface of the power conversion unit 101.

FIG. 13 is a perspective view showing a structure of a front surface of a main-circuit bus bar assembly 151.

FIG. 14 is a perspective view showing a structure of a back surface of the main-circuit bus bar assembly 151.

FIG. 15 is an exploded perspective view showing a structure of the front surface of the main-circuit bus bar assembly 151.

FIG. 16 is an exploded perspective view showing a structure of the back surface of the main-circuit bus bar assembly 151.

FIG. 17 is a perspective view showing a structure of a front surface of a unit-interconnect bus bar assembly 161.

FIG. 18 is a perspective view showing a structure of a back surface of the unit-interconnect bus bar assembly 161.

FIG. 19 is an exploded perspective view showing a structure of the front surface of the unit-interconnect bus bar assembly 161.

FIG. 20 is an exploded perspective view showing a structure of the back surface of the unit-interconnect bus bar assembly 161.

DESCRIPTION OF EMBODIMENTS

Hereinafter, an embodiment of the present invention will be explained with reference to the drawings.

An UPS (Uninterruptible Power Supply) will be explained as an embodiment.

FIG. 1 shows a configuration of the UPS according to the embodiment.

An UPS 2 adopts a continuous inverter power supply system capable of continuing power supply without interruption at the time of power failure. The present invention can be applied not only to the continuous inverter power supply system but also to other systems such as a continuous commercial power supply system.

A three-phase AC commercial power supply 3 supplies power to a load 4 via a converter 11 and an inverter 12 at normal operation. Here, the converter 11 converts the three-phase AC commercial power 3 into a DC voltage 5 and supplies the power to the inverter 12. The inverter 12 converts the DC voltage into a three-phase AC power 6. Accordingly, even when voltage fluctuation such as an instantaneous voltage drop occurs in the commercial power supply 3, the power equivalent to the normal commercial power supply can be stably supplied to the load 4 by being controlled by the converter 11 and the inverter 12.

On the other hand, at the time of the power failure, the power is supplied to the load 4 from a storage battery 14 through the inverter 12 in a state where the inverter 12 is activated. Accordingly, the UPS 2 can supply the power to the load 4 without interruption. In the embodiment, the total voltage of the storage battery 14 is sufficiently reduced to be lower than the DC voltage applied to the inverter 12 for reducing the volume of the UPS 2. Accordingly, the UPS 2 according to the embodiment is provided with a boost chopper 13 which boosts a low DC voltage outputted by the discharge of the storage battery 14 to a desired DC voltage 5 and outputs the voltage to the inverter 12. The UPS 2 can be applied to a UPS 2 having a high-voltage storage battery 14 which can supply a desired DC voltage without providing the boost chopper 13 when there is no constraint of the volume.

In the following description, the converter 11, the inverter 12 and the boost chopper 13 are collectively called a power conversion part 2a.

The UPS 2 may further include a cooling mechanism cooling the power conversion part 2a.

A bypass circuit 17 bypasses the power conversion part 2a in accordance with an instruction to directly connect the commercial power supply 3 to the load 4. A maintenance bypass circuit 16 bypasses the power conversion part 2a and the bypass circuit 17 in accordance with an instruction for maintaining the power conversion part 2a and the bypass circuit 17 to directly connect the commercial power supply 3 to the load 4.

FIG. 2 shows a circuit configuration of the converter 11.

The three-phase AC power from the commercial power supply 3 is suppled to AC terminals R, S and T of the converter 11, which is rectified in a switching device 21 and a rectifying device 23 in an upper arm, a switching device 22 and a rectifying device 24 in a lower arm and a capacitor group 120 in respective phases of R, S and T and outputted to DC terminals P and N. In the embodiment, IGBTs (Insulated Gate Bipolar Transistor) are used as the switching devices 21 and 22, and diodes are used as the rectifying devices 23 and 24, however, the present invention is not limited to this, and other types of devices can be adopted.

FIG. 3 shows a circuit configuration of the inverter 12.

The DC voltage 5 converted by the converter 11 or the boost chopper 13 is supplied to DC terminals P and N of the inverter 12, which is converted in the switching device 21 and the rectifying device 23 in an upper arm, the switching device 22 and the rectifying device 24 in a lower arm and the capacitor group 120 in respective phases of U, V and W into the AC power 6 and outputted to AC terminals U, V and W. The three-phase AC outputted from AC terminals U, V and W is supplied to the load 4.

FIG. 4 shows a circuit configuration of the boost chopper 13.

An output of the storage battery 14 is supplied to an input terminal Bat. While the switching device 22 in a lower arm is turned on, energy is accumulated in a reactor 15 connected between the input terminal Bat and an AC terminal C. Next, the rectifying device 23 in an upper arm is turned on by counter electromotive voltage generated by the reactor 15 when the switching device 22 in the lower arm is turned off. Accordingly, an added voltage of the DC voltage outputted from the storage voltage 14 and the counter electromotive voltage of the reactor 15 appears at output terminals P and N of the boost chopper 13, and the boosted DC voltage is outputted.

As described above, any of the converter 11, the inverter 12 and the boost chopper 13 mounted on the UPS 2 according to the embodiment has at least one basic circuit including a power semiconductor module group 110 as a 2-level half bridge circuit in which the switching device 21 and the rectifying device 23 in the upper arm and the switching device 22 and the rectifying device 24 in the lower arm are connected in series, the capacitor group 120, a positive-electrode side fuse 131 and a negative-electrode side fuse 132. A conversion circuit of 3-level or more may be used instead of the 2-level half bridge circuit.

In the embodiment, the basic circuit is realized by a power conversion unit 101, and the converter 11, the inverter 12 and the boost chopper 13 are realized by combination of the power conversion units 101. Accordingly, types of components used for the power conversion part 2a are made common, thereby facilitating assembly and maintenance of the power conversion part 2a.

FIG. 5 shows a configuration of the power conversion unit 101.

In the power conversion unit 101, the power semiconductor module group 110 is realized by connecting in parallel a 2-in-1 type first power semiconductor module 111 and a second power semiconductor module 112 which form upper and lower arms respectively. The capacitor group 120 is realized by connecting in parallel a first capacitor 121 and a second capacitor 122. Accordingly, the power semiconductor module group 110 and the capacitor group 120 corresponding to the power required in the power conversion unit 101 can be realized by using plural power semiconductor modules and plural capacitors.

Furthermore, the fuse 131 is connected in series in the positive electrode side and the fuse 132 is connected in series in the negative electrode side with respect to the power semiconductor module group 110 and the capacitor group 120 in the power conversion unit 101. A second terminal 131b of the positive-electrode side fuse 131 corresponds to the P-terminal in the converter 11, the inverter 12 and the boost chopper 13. A second terminal 132b of the negative-electrode side fuse 132 corresponds to the N-terminal in the converter 11, the inverter 12 and the boost chopper 13. As the power conversion unit 101 has the fuses 131 and 132, reliability of the power conversion unit 101 at the time of a short-circuit failure can be improved. In the case where the power conversion unit 101 is cut off by a breaker or other cases, any or both of the fuses 131 and 132 may be omitted.

Each of the power semiconductor modules 111 and 112 includes the switching device 21 and the rectifying device 23 in the upper arm and the switching device 22 and the rectifying device 24 in the lower arm. Points between the upper arms and the lower arms in respective power semiconductor modules 111 and 112 are connected to an external AC terminal 154T. Gate terminals of the switching devices 21 of the upper arms in respective power semiconductor modules 111 and 112 are connected to a gate terminal 111g. Gate terminals of the switching devices 22 in the lower arms in respective power semiconductor modules 111 and 112 are connected to a gate terminal 112g.

FIG. 6 is a perspective view showing a structure of the power conversion part 2a.

Hereinafter, coordinates of the UPS 2 are fixed to an X-axis, a Y-axis and a Z-axis. A Y-axis direction indicates a front direction of the UPS 2, a Z-axis direction indicates an upper direction of the UPS 2 and an X-axis direction indicates a left direction of the UPS 2. Here, the power conversion part 2a is provided inside a casing (not shown) of the UPS 2, and an opening and closing door (not shown) which is opened at the time of maintenance of the UPS 2 is provided in the Y-axis direction of the power conversion part 2a, namely, the front of the casing of the UPS 2. It is possible to access easily to the front of the power conversion part 2a by opening the opening and closing door.

The power conversion part 2a includes plural power conversion units 101 arranged in the X-axis direction. The converter 11 includes three power conversion units 101 respectively corresponding to three phases of the commercial power supply. The inverter 12 also includes three power conversion units 101 respectively corresponding to three phases.

The boost chopper 13 includes two power conversion units 101 connected in parallel. The boost chopper 13 can be one power conversion unit 101. When the power required for the boost chopper 13 exceeds a rated power of the power semiconductor module group 110 provided in the power conversion unit 101, N-pieces of power conversion units 101 are connected in parallel to thereby multiply the allowable power by N-times. For the same purpose, each of the converter 11 and the inverter 12 may have plural power conversion units 101 which are connected in parallel per one phase if necessary.

The plural power conversion units 101 in the power conversion part 2a are connected in parallel through a unit-interconnect bus bar assembly 161. Respective longitudinal directions of the plural power conversion units 101 correspond to the Z direction, and the plural power conversion units 101 are arranged in the X direction. A longitudinal direction of the unit-interconnect bus bar assembly 161 corresponds to the X direction, and the unit-interconnect bus bar assembly 161 is arranged in a +Y direction of the plural power conversion units 101. That is, respective longitudinal directions of the plural power conversion units 101 cross the longitudinal direction of the unit-interconnect bus bar assembly 161. Accordingly, the plural power conversion units 101 can be efficiently arranged in a limited volume.

FIG. 7 is an exploded perspective view showing a structure of the power conversion part 2a.

The unit-interconnect bus bar 161 is assembled to the second terminals 131b of the positive-electrode side fuses 131 and the second terminals 132b of the negative-electrode side fuses 132 arranged in a front surface of a lower part of respective power conversion units 101 by using attaching screws 169.

FIG. 8 is a front view showing a structure of the power conversion part 2a.

The respective external AC terminals 154T provided on upper edges of the plural power conversion units 101 correspond to R, S and T terminals of the converter 11, U, V and W terminals of the inverter 12 and C, C terminals (common) of the boost chopper 13. In two terminals provided in the left end of the unit-interconnect bus bar assembly 161, an upper terminal corresponds to the P-terminal in the converter 11, the inverter 12 and the boost chopper 13, and a lower terminal corresponds to the N-terminal in the converter 11, the inverter 12 and the boost chopper 13.

FIG. 9 is a right side view showing a structure of the power conversion unit 101.

The power conversion unit 101 includes the power semiconductor module group 110, the capacitor group 120, the fuses 131 and 132 and a main-circuit bus bar assembly 151 electrically connecting the above. A cooling fin 113 is provided in the back (−Y direction) of the power semiconductor module group 110, which cools the power semiconductor module group 110. These components are arranged in the order of the power semiconductor module group 110, the capacitor group 120, the fuses 131 and 132 in a downward direction (−Z direction). The casing is designed and the cooling mechanism is provided so that air for cooling the cooling fin 113 flows in an upward direction (+Z direction) on the back side of the main-circuit bus bar assembly 151. The reason of the arrangement is for preventing the capacitor group 120 and so on from receiving a fanned heat from the cooling fan 113 as the cooling fin 113 is positioned in the leeward side of an air passage, namely, on the upper (+Z) side with respect to the capacitor group 120. Though the cooling fin 113 is arranged in the -Y direction in the embodiment, the setting direction of the cooling fin 113 is determined in accordance with the air passage, such that the cooling fin 113 is arranged in +Z direction, for example, when the air passage is in the −Y direction. Moreover, the power semiconductor module group 110 is provided adjacent to the capacitor 120, thereby reducing a parasitic inductance formed in the main-circuit bus bar assembly 151 connecting the power semiconductor module 110 to the capacitor group 120, reducing a surge voltage generating at the time of switching and reducing an impedance generated from the power semiconductor module group 110 inside the power conversion unit 101 of itself to the capacitor group 120 inside an adjacent power conversion unit 101 to the smallest value as described below, therefore, not only the capacitor group 120 of the power conversion unit 101 of itself but also the capacitor groups 120 of other power conversion units 101 can be effectively used. As a result, the capacitance of the capacitor group used per one power conversion unit 101 can be reduced and the volume of the power conversion unit 101 can be also reduced.

The power semiconductor module group 110 and the capacitor group 120 having terminals protruding in the front (+Y) direction are arranged in the rear (−Y) direction with respect to the main-circuit bus bar assembly 151. According to the structure, all the terminals of the power semiconductor module group 110 and the capacitor group 120 are positioned in the front surface, which facilitates works such as checks of terminal portions at the maintenance, installation and removal thereof.

FIG. 10 is a perspective view showing a structure of the power conversion unit 101.

In each of the fuses 131 and 132, one terminal is provided in the rear (−Y) direction and the other terminal is provided in the front (+Y) direction. The fuses 131 and 132 are arranged in the front (+Y) direction with respect to the main-circuit bus bar assembly 151. That is, a first terminal 131a of the positive-electrode side fuse 131 and a first terminal 132a of the negative-electrode side fuse 132 are directed to the rear (−Y) direction and are connected to the main-circuit bus bar assembly 151 by attaching screws 139. On the other hand, the second terminal 131b of the positive-electrode side fuse 131 and the second terminal 132b of the negative-electrode side fuse 132 are directed to the front (+Y) direction. According to the arrangement, the second terminal 131b of the positive-electrode side fuse 131 and the second terminal 132b of the negative-electrode side fuse 132 which are terminals for connecting the power conversion unit 101 of itself to another power conversion unit 101 are positioned in a front surface of the UPS 2, which makes front accessibility at the time of assembly and maintenance good and improves workability. Here, as external terminals included in the power conversion unit 101, the total three terminals which are the second terminal 131b of the positive-electrode side fuse 131, the second terminal 132b of the negative-electrode side fuse 132 connected to the unit-interconnect bus bar assembly 161 for connecting to another power conversion unit 101 and the external AC terminal 154T provided in the main-circuit bus bar assembly 151 as described above.

FIG. 11 is an exploded perspective view showing a structure of a front surface of the power conversion unit 101, and FIG. 12 is an exploded perspective view showing a structure of a back surface of the power conversion unit 101.

In the embodiment, the power semiconductor modules 111 and 112 which are respectively 2-level half bridge circuits (2-in-1) connected in parallel are mounted on the power semiconductor module group 110. The parallel number of power semiconductor modules in the power conversion unit 101 may be the necessary minimum of the parallel number in which the minimum power can be allowed by using a model requiring the minimum power as a reference in a line-up of power converters such as the UPS and other devices using the power conversion unit 101. This is because desired electric energy can be satisfied with respect to models requiring higher power by arranging the power conversion unit in parallel. The parallel number of the power semiconductor modules is two in the embodiment in consideration of the above point.

Respective power semiconductor modules 111 and 112 are provided with positive electrode terminals 111p and 112p, negative electrode terminals 111n and 112n, AC terminals 111ac and 112ac and control terminal groups 111d and 112d. The control terminal groups 111d and 112d respectively include the gate terminals 111g and 112g.

The respective positive electrode terminals 111p and 112p in the power semiconductor module group 110 are connected to positive electrode-connection terminals 152p in the main-circuit bus bar assembly 151. The respective negative electrode terminals 111n and 112n in the power semiconductor module group 110 are connected to negative electrode-connection terminals 153n in the main-circuit bus bar assembly 151. The respective AC terminals 111ac and 112ac in the power semiconductor module group 110 are connected to connection terminals 154ac connected to the external AC terminal 154T. These positive electrode terminals 111p and 112p, the negative electrode terminals 111n and 112n, and the AC terminals 111ac and 112ac are respectively connected to the main-circuit bus bar assembly 151 by using connection methods such as welding. These terminals may be connected by screws, clips or the like.

In order to reduce the difference between a distance from the capacitor group 120 to the positive electrode terminal 111p and the negative electrode terminal 111n of the power semiconductor module 111 and a distance from the capacitor group 120 to the positive electrode 112p and the negative electrode terminal 112n of the power semiconductor module 112, an arrangement of the positive electrode terminal 111p and the negative electrode terminal 111n aligned in the X-axis direction of one power semiconductor module 111 and an arrangement of the positive electrode 112p and the negative electrode terminal 112n of the other power semiconductor module 112 are reversed. Furthermore, the positive electrode terminal 111p and the negative electrode terminal 111n in the power semiconductor module 111 are closely arranged so as to face each other, and the positive electrode 112p and the negative electrode terminal 112n of the power semiconductor module 112 are closely arranged so as to face each other. According to the arrangement, the difference of impedances generated between the power semiconductor modules 111, 112 and the capacitors 121, 122 is reduced, thereby improving the balance of electric current flowing in the power semiconductor module 111 and the power semiconductor module 112.

A positive electrode terminal 121p and a negative electrode terminal 121n included in the capacitor 121 are attached to a capacitor connection point 156 provided in the main-circuit bus bar assembly 151 by using capacitor attaching screws 129. Similarly, a positive electrode terminal 122p and a negative electrode terminal 122n included in the capacitor 122 are attached to a capacitor connection point 157 provided in the main-circuit bus bar assembly 151 by using the capacitor attaching screws 129.

FIG. 13 is a perspective view showing a structure of a front surface of the main-circuit bus bar assembly 151 and FIG. 14 is a perspective view showing a back surface of the main-circuit bus bar assembly 151.

Capacitor connection parts 156p and 156n are provided on a back surface of the capacitor connecting point 156, and capacitor connection parts 157p and 157n are provided on a back surface of the capacitor connection point 157. In the opposite side of the capacitor connection parts 156p and 156n with respect to the main-circuit bus bar assembly 151, capacitor attaching screw connection parts 156pf and 156nf are respectively provided. In the opposite side of the capacitor connection parts 157p, and 157n with respect to the main-circuit bus bar assembly 151, capacitor attaching screw connection parts 157pf and 157nf are respectively provided. The positive electrode terminal 121p and the negative electrode terminal 121n of the capacitor 121 are respectively fixed to the back surface of the capacitor connection point 156 by using the capacitor attaching screws 129 on the front surface of the capacitor connection point 156. Accordingly, the positive electrode terminal 121p and the negative electrode terminal 121n of the capacitor 121 respectively contact the capacitor connection parts 156p and 156n, and the respective capacitor attaching screws 129 contact the capacitor attaching screw connection parts 156pf and 156nf. Furthermore, the positive electrode terminal 122p and the negative electrode terminal 122n of the capacitor 122 are respectively fixed to the back surface of the capacitor connection point 157 by using the capacitor attaching screws 129 on the front surface of the capacitor connection point 157. Accordingly, the positive electrode terminal 122p and the negative electrode terminal 122n of the capacitor 122 respectively contact the capacitor connection parts 157p and 157n, and the respective capacitor attaching screws 129 respectively contact the capacitor attaching screw connection parts 157pf and 157nf.

Fuse connection parts 158 and 159 are provided in the front surface of the main-circuit bus bar assembly 151 and fuse attaching screw connection parts 158b and 159b are provided in the opposite side of the fuse connection parts 158 and 159 with respect to the main-circuit bus bar assembly 151. The first terminal 131a of the positive-electrode side fuse 131 is fixed to a front surface of the fuse connection part 158 by using the fuse attaching screw 139 in a back surface of the fuse attaching screw connection part 158b. Accordingly, the first terminal 131a of the positive-electrode side fuse 131 contacts the fuse connection part 158, and the fuse attaching screw 139 contacts the fuse attaching screw connection part 158b. Furthermore, the first terminal 132a of the negative-electrode side fuse 132 is fixed to a front surface of the fuse connection part 159 by using the fuse attaching screw 139 in a back surface of the fuse attaching screw connection part 159b. Accordingly, the first terminal 132a of the negative-electrode side fuse 132 contacts the fuse connection part 159, and the fuse attaching screw 139 contacts the fuse attaching screw connection part 159b.

FIG. 15 is an exploded perspective view showing a structure of the front surface of the main-circuit bus bar assembly 151 and FIG. 16 is an exploded perspective view showing the back surface of the main-circuit bus bar assembly 151.

The main-circuit bus bar assembly 151 includes a positive electrode conductor 152, a negative electrode conductor 153, an AC conductor 154 and an insulator 155. The positive electrode conductor 152, the negative electrode conductor 153 and the AC conductor 154 have a flat plate shape. The positive electrode conductor 152 and the negative electrode conductor 153 are laminated so that surfaces facing each other closely contact each other in parallel through the insulator 155 for reducing a parasitic inductance appearing between the power semiconductor module group 110 and the capacitor group 120. Accordingly, a ripple current and an impedance in the main-circuit bus bar assembly 151 can be reduced and the surge voltage generating at the time of switching can be reduced. Furthermore, the insulator 155 covers most part of the positive electrode conductor 152, the negative electrode conductor 153 and the AC conductor 154 which are laminated so that these conductors keep given insulation distances. Here, conductor surfaces in the front surface and the back surface of the main-circuit bus bar assemble 151 maybe exposed within a range where the given insulation distances can be kept for improving heat radiation performance. An insulating resin with good flowability or the like is used for the insulator 155.

Though the AC conductor 154, the positive electrode conductor 152 and the negative electrode conductor 153 are arranged in this order in the rear (−Y) direction in the embodiment, the parasitic inductance is not affected even when the order of arranging these conductors is changed as long as the positive electrode conductor 152 and the negative electrode conductor 153 are arranged to be closest to each other. These conductors are formed by using materials having high conductivity such as copper and aluminum from a piece of conductor plate by processing such as cutting and folding. The explanation will be made by citing the positive electrode conductor 152 as an example. As a forming method, an opening 152h for allowing all the terminals 111p, 111n, 111ac, 111d, 112p, 112n, 112ac and 112d of the power semiconductor modules 111 and 112 to penetrate therethrough is cut out while leaving portions to be connection terminals 152p for connecting to the positive electrode terminals 111p and 112p inside a plane of the conductor plate based on a piece of conductor plate. Then, the portions left in the plane of the conductive plate to be the connection terminals 152p are folded by 90 degrees in the front (+Y) direction to thereby form the connection terminals 152p. The above forming method is the same with respect to the negative electrode conductor 153 and the AC conductor 154.

The positive electrode conductor 152 includes the two connection terminals 152p respectively connected to the positive electrode terminals 111p and 112p of the power semiconductor module group 110. The negative electrode conductor 153 includes the two connection terminals 153n respectively connected to the negative electrode terminals 111n and 112n of the power semiconductor module group 110. The AC conductor 154 includes the two connection terminals 154ac respectively connected to the AC terminals 111ac and 112ac of the power semiconductor module group 110, and the AC terminal 154T connected to the outside.

In the capacitor connection points 156 and 157, the negative electrode terminals 121n and 122n of the capacitors 121 and 122 abut on the capacitor connection parts 156n and 157n provided on a back surface of the negative electrode conductor 153. Furthermore, the capacitor connecting parts 156p and 157p which protrude from the positive electrode conductor 152 in the rear (−Y) direction are provided so that the positive electrode terminals 121p and 122p of the capacitors 121 and 122 abut on the conductor on the same virtual plane as the back surface of the negative electrode conductor 153. The capacitor connection parts 156p and 157p are formed separately from the positive electrode conductor 152, which are connected to the positive electrode conductor 152 by means such as brazing, soldering and caulking. The capacitor connection parts 156p and 157p may also be manufactured by using a means of cutting from a piece of conductor plate so that the capacitor connection parts 156p and 157p remain in a protruding manner, or a means of casting such as die-casting. The capacitor connection parts 156p and 157p are provided with holes for allowing the capacitor attaching screws 129 to penetrate therethrough. Openings 156h and 157h are provided in the negative electrode conductor 153 for avoiding the protruding positive electrode capacitor connection parts 156p and 157p from contacting the negative electrode conductor 153.

Furthermore, in the capacitor connection points 156 and 157, the capacitor attaching screws 129 respectively fixing the positive electrode terminal 121p of the capacitor 121 and the positive electrode terminal 122p of the capacitor 122 abut on the capacitor connecting parts 156pf and 157pf provided on the front surface of the positive electrode conductor 152. Moreover, the capacitor connection parts 156nf and 157nf protruding in the front (+Y) direction from the negative electrode conductor 153 are provided so that the capacitor attaching screws 129 respectively fixing the negative electrode terminal 121n of the capacitor 121 and the negative electrode terminal 122n of the capacitor 122 abut on the conductor on the same virtual plane as the front surface of the positive electrode conductor 152. The capacitor connection parts 156nf and 157nf are formed separately from the negative electrode conductor 153, which are connected to the negative electrode conductor 153 by the same means as the capacitor connection parts 156p and 157p. The capacitor connection parts 156nf and 157nf are provided with holes for allowing the capacitor attaching screws 129 to penetrate therethrough. The openings 156h and 157h are provided in the positive electrode conductor 152 for avoiding the protruding negative electrode capacitor connection parts 156*nf* and 157*nf* from contacting the positive electrode conductor 152.

In a connection point between the main-circuit bus bar assembly 151 and the fuses 131, 132, the first terminal 131*a* of the positive-electrode side fuse 131 abuts on the fuse connection part 158 provided in the front surface of the positive electrode conductor 152. Furthermore, the fuse connection part 159 protruding in the front (+Y) direction from the negative electrode conductor 153 is provided so that the first terminal 132*a* of the negative-electrode side fuse 132 abuts on the conductor on the same virtual plane (second virtual plane) as the front surface of the positive electrode conductor 152. The fuse connection part 159 is formed separately from the negative electrode conductor 153, which is connected to the negative electrode conductor 153 by the same means as the capacitor connection parts 156*p* and 157*p*. The fuse connection part 159 is provided with a hole for allowing the fuse attaching screw 139 to penetrate therethrough. An opening 159*h* is provided in the positive electrode conductor 152 for avoiding the protruding negative electrode fuse connection part 159 from contacting the positive electrode conductor 152.

The first terminal 131*a* of the positive-electrode side fuse 131 and the first terminal 132*a* of the negative-electrode side fuse 132 abut on the main-circuit bus bar assembly 151 on the same virtual plane, thereby facilitating attachment of the fuses 131 and 132 as well as facilitating handling of the main-circuit bus bar assembly 151.

Furthermore, in the connection point between the main-circuit bus bar assembly 151 and the fuses 131, 132, the fuse attaching screw 139 fixing the first terminal 132*a* of the negative-electrode side fuse 132 abuts on the fuse connection part 158 provided in the back surface of the negative electrode conductor 153. Furthermore, the fuse connection part 158*b* protruding in the rear (−Y) direction from the negative electrode conductor 153 is provided so that the fuse attaching screw 139 fixing the first terminal 131*a* of the positive-electrode side fuse 131 abuts on the conductor on the same virtual plane as the back surface of the negative electrode conductor 153. The fuse connection part 158*b* is formed separately from the positive electrode conductor 152, which is connected to the positive electrode conductor 152 by the same means as the capacitor connection parts 156*p* and 157*p*. The fuse connection part 158*b* is provided with a hole for allowing the fuse attaching screw 139 to penetrate therethrough. An opening 158*h* is provided in the negative electrode conductor 153 for avoiding the protruding positive-electrode fuse connection part 158*b* from contacting the negative electrode conductor 153.

FIG. 17 is a perspective view showing a structure of a front surface of the unit-interconnect bus bar assembly 161, FIG. 18 is a perspective view showing a structure of a back surface of the unit-interconnect bus bar assembly 161, FIG. 19 is an exploded perspective view showing a structure of the front surface of the unit-interconnect bus bar assembly 161 and FIG. 20 is an exploded perspective view showing a structure of the back surface of the unit-interconnect bus bar assembly 161.

The unit-interconnect bus bar assembly 161 includes a positive electrode conductor 162, a negative electrode conductor 163 and an insulator 164. The positive electrode conductor 162 and the negative electrode conductor 163 have a flat plate shape. An external positive electrode terminal 162T and an external negative electrode terminal 163T connected to the outside of the power conversion part 2*a* are respectively provided in the left end of the positive electrode conductor 162 and the negative electrode conductor 163. The external positive electrode terminal 162T and the external negative electrode terminal 163T respectively correspond to the P-terminal and the N-terminal. The positive electrode conductor 162 and the negative electrode conductor 163 are laminated through the insulator 164 so that surfaces facing each other closely contact each other in parallel for reducing a parasitic inductance appearing between a fuse of the power conversion unit 101 of itself and a fuse of an adjacent power conversion unit 101. Accordingly, a current ripple and an impedance in the unit-interconnect bus bar assembly 161 are reduced, an impedance from the power semiconductor module 110 of the power conversion unit 101 of itself to the capacitor group 120 included in an adjacent power conversion unit 101 can be reduced to the smallest value, therefore, not only the capacitor group 120 of the power conversion unit 101 of itself but also the capacitor groups 120 of other power conversion units 101 can be effectively used. As a result, the capacitance of the capacitor group 120 per one power conversion unit 101 can be reduced and the volume of the power conversion unit 101 can be reduced. The insulator 164 covers most part of the positive electrode conductor 162 and the negative electrode conductor 163 which are laminated so that these conductors keep a given insulation distance. Here, conductor surfaces in the front surface and the back surface of the unit-interconnect bus bar assemble 161 may be exposed within a range where the given insulation distance can be kept for improving heat radiation performance. An insulating resin with good flowability or the like is used for the insulator 164.

Though the negative electrode conductor 163 and the positive electrode conductor 162 are arranged in this order in the rear (−Y) direction in the embodiment, the parasitic inductance is not affected even when the order of arranging these conductors is changed as long as the positive electrode conductor 162 and the negative electrode conductor 13 are arranged to be closest to each other. These conductors are formed by using materials having high conductivity such as copper and aluminum from a piece of conductor plate by processing such as cutting.

In a connection point between the unit-interconnect bus bar assembly 161 and the fuses 131, 132, the second terminals 131*b* of the positive-electrode side fuses 131 abut on connection parts 165 provided in a back surface of the positive electrode conductor 162. Furthermore, connection parts 166 protruding in the rear (−Y) direction from the negative electrode conductor 163 are provided so that the second terminals 132*b* of the negative-electrode side fuses 132 abut on the negative electrode conductor on the same virtual plane (first virtual plane) as the back surface of the positive electrode conductor 162. The connection parts 166 are formed separately from the negative electrode conductor 163, which are connected to the negative electrode conductor 163 by the same means as the capacitor connection parts 156*p* and 157*p* in the main-circuit bus bar assembly 151. The connection parts 166 are provided with holes for allowing the attaching screws 169 to penetrate therethrough. Openings 166*h* are provided in the positive electrode conductor 162 for avoiding the protruding negative electrode connection parts 166 from contacting the positive electrode conductor 162.

The second terminals 131*b* of the positive-electrode side fuses 131 and the second terminals 132*b* of the negative-electrode side fuses 132 abut on the unit-interconnect bus bar assembly 161 on the same virtual plane, thereby facilitating attachment of the fuses 131 and 132 as well as facilitating handling of the unit-interconnect bus bar assembly 161.

Furthermore, in connection points between the unit-interconnect bus bar assembly 161 and the fuses 131, 132, attaching screws 169 fixing the second terminals 132b of the negative-electrode side fuses 132 abut on connection parts 166f provided on a front surface of the negative electrode conductor 163. Moreover, connection parts 165f protruding in the front (+Y) direction from the positive electrode conductor 162 are provided so that the attaching screws 169 fixing the second terminals 131b of the positive-electrode side fuses 131 abut on the positive electrode conductor on the same virtual plane as the front surface of the negative electrode conductor 163. The connection parts 165f are formed separately from the positive electrode conductor 162, and are connected to the positive electrode conductor 162 by the same means as the capacitor connection parts 156p and 157p of the main-circuit bus bar assembly 151. The connection parts 165f are provided with holes for allowing the attaching screws 169 to penetrate therethrough. Openings 165h are provided in the negative electrode conductor 163 for avoiding the protruding positive electrode connection parts 165f from contacting the negative electrode conductor 163.

According to the structure of the above embodiment, various power converters such as the converter 11, the inverter 12 and the boost chopper 13 can be arbitrarily constructed by connecting the appropriate number of power conversion units 101 in parallel in accordance with the desired electric energy and the number of phases. The power conversion unit 101 is manufactured as a minimum configuration unit, thereby standardizing components in many kinds of power converters, which can reduces costs. Moreover, when the standardized power conversion units 101 are used, an orderly layout can be obtained when they are arranged in parallel, which improves the easiness of connection wiring between units and the entire assemblability. As the terminal groups of the power semiconductor modules, the capacitor terminals, the fuse terminals included in the power conversion unit 101, and the unit-interconnect bus bar assembly 161 connecting the power conversion units 101 to one another exist on the front surfaces of the power converters, the accessibility to the front surfaces is excellent at the time of assembly and maintenance, which improves workability.

A method of manufacturing the power conversion part 2a will be explained. First, a manufacturing worker arranges plural power conversion unit 101 in the +X direction and arranges the unit-interconnect bus bar assembly 161 in the +Y direction with respect to the plural power conversion units 101. After that, the manufacturing worker connects the plural positive electrode conductors 152 respectively included in the plural power conversion unit 101 through the positive electrode conductor 162 included in the unit-interconnect bus bar assembly 161 and connects the plural negative electrode conductors respectively included in the plural power conversion unit 101 through the negative electrode conductor 163 included in the unit-interconnect bus bar assembly 161. Accordingly, the power conversion part 2a can be manufactured. It is also possible to manufacture the converter 11, the inverter 12, the boost chopper 13 and the like by using plural power conversion units 101. The manufacturing worker can also manufacture the UPS 2 by connecting the storage battery 14, the maintenance bypass circuit 16, the bypass circuit 17 and so on to plural AC terminals 154T respectively included in plural power conversion units 101.

Terms will be explained. A power conversion unit corresponds to the power conversion unit 101 or the like. A positive electrode conductor corresponds to the positive electrode conductor 152 or the like. A negative electrode conductor corresponds to the negative electrode conductor 153 or the like. An AC conductor corresponds to the AC conductor 154 or the like. A circuit connection part corresponds to the main-circuit bus bar assembly 151 or the like. A power semiconductor module corresponds to the power semiconductor module group 110 or the like. A capacitor corresponds to the capacitor group 120 or the like. A unit connection part corresponds to the unit-interconnect bus bar assembly 161 or the like. A positive electrode connection conductor corresponds to the positive electrode conductor 162 or the like. A negative electrode connection conductor corresponds to the negative electrode conductor 163 or the like. Two 2-level half bridge circuits correspond to the power semiconductor modules 111, 112 or the like. Two capacitors correspond to the capacitors 121, 122 or the like. A positive electrode fuse corresponds to the fuse 131 or the like. A negative electrode fuse corresponds to the fuse 132 or the like. Power converters correspond to the converter 11, the inverter 12, the boost chopper 13, the power conversion part 2a, the UPS 2 and the like. A unit corresponds to the power conversion unit 101 or the like. A positive electrode connection terminal corresponds to the second terminal 131b and so on. A negative electrode connection terminal corresponds to the second terminal 132b or the like. A laminated bus bar plate corresponds to the unit-interconnect bus bar assembly 161 or the like. A laminated plate corresponds to the main-circuit bus bar assembly 151 or the like. One-side terminal of the first power semiconductor module corresponds to the positive electrode terminal 111p or the like. The other side terminal of the first power semiconductor module corresponds to the AC terminal lilac or the like. One-side terminal of the second power semiconductor module corresponds to the AC terminal 112ac or the like. The other-side terminal of the second power semiconductor module corresponds to the negative electrode terminal 112n or the like.

The present invention is not limited to the above embodiment and may be altered to other various forms within a scope not departing from the gist of the invention.

Reference Signs List

1: power converter, 2: UPS (Uninterruptible Power Supply), 11: converter, 12: inverter, 13: boost chopper, 101: power conversion unit, 110: power semiconductor module group, 111, 112: power semiconductor module, 113: cooling fin, 120: capacitor group, 121, 122: capacitor, 131, 132: fuse, 151: main-circuit bus bar assembly, 152: positive electrode conductor, 153: positive electrode conductor, 154: AC conductor, 154T: external AC terminal, 155: insulator, 161: unit-interconnect bus bar assembly, 162: positive electrode conductor, 162T: external positive electrode terminal, 163: negative electrode conductor, 163T: external negative electrode terminal, 164: insulator

The invention claimed is:

1. A power conversion unit comprising:
a circuit connection part including a plurality of conductors having different potentials, that is, at least a positive electrode conductor having an external positive terminal, at least a negative electrode conductor having an external negative terminal, and at least an AC conductor having an external AC terminal, wherein the circuit connection part has an approximately flat plate-like structure with a front side and a rear side;

a power semiconductor module connected to some of the plurality of conductors at the rear side of the circuit connection part; and at least a capacitor connected to some of the plurality of conductors at the rear side of the circuit connection part, wherein the positive electrode conductor is connectable to a different positive electrode conductor of a different power conversion unit through a unit connection part that is connected to the positive electrode conductor at the front side of the circuit connection part, and wherein the negative electrode conductor is connectable to a different negative electrode conductor of the different power conversion unit through the unit connection part that is connected to the negative electrode conductor at the front side of the circuit connection part.

2. The power conversion unit according to claim 1, wherein the positive electrode conductor, the negative electrode conductor, and the AC conductor are shaped like a flat plate; and wherein the positive electrode conductor, the negative electrode conductor, and the AC conductor are stacked together via an insulator.

3. The power conversion unit according to claim 1, wherein the circuit connection part, the power semiconductor module, and a capacitor forms a conversion circuit; and wherein the conversion circuit is a two or more multi-level conversion circuit.

4. A power conversion device comprising:

a plurality of power conversion units;

wherein the power conversion units each include:

a circuit connection part including a plurality of conductors having different potentials, that is, at least a positive electrode conductor having an external positive terminal, at least a negative electrode conductor having an external negative terminal, and at least an AC conductor having an external AC terminal, wherein the circuit connection part has an approximately flat plate-like structure with a front side and a rear side;

a power semiconductor module connected to some of the plurality of conductors at the rear side of the circuit connection part; and at least a capacitor connected to some of the plurality of conductors at the rear side of the circuit connection part, wherein the positive electrode conductor is connectable to a different positive electrode conductor of a different power conversion unit through a unit connection part that is connected to the positive electrode conductor at the front side of the circuit connection part, and wherein the negative electrode conductor is connectable to a different negative electrode conductor of the different power conversion unit through the unit connection part that is connected to the negative electrode conductor at the front side of the circuit connection part.

5. The power conversion device according to claim 4, wherein the positive electrode conductor, the negative electrode conductor, and the AC conductor are shaped like a flat plate; and wherein the positive electrode conductor, the negative electrode conductor, and the AC conductor are stacked together via an insulator.

6. The power conversion device according to claim 4, wherein the circuit connection part, the power semiconductor module, and a capacitor forms a conversion circuit; and wherein the conversion circuit is a two or more multi-level conversion circuit.

* * * * *